US011810911B2

(12) United States Patent
Rouviere et al.

(10) Patent No.: US 11,810,911 B2
(45) Date of Patent: Nov. 7, 2023

(54) MONOLITHIC COMPONENT COMPRISING A GALLIUM NITRIDE POWER TRANSISTOR

(71) Applicants: STMICROELECTRONICS APPLICATION GMBH, Aschheim-Dornach (DE); STMICROELECTRONICS (TOURS) SAS, Tours (FR)

(72) Inventors: Mathieu Rouviere, Tours (FR); Arnaud Yvon, Saint-Cyr sur Loire (FR); Mohamed Saadna, Saint Cyr-sur-Loire (FR); Vladimir Scarpa, Dusseldorf (DE)

(73) Assignees: STMICROELECTRONICS APPLICATION GMBH, Aschheim-Dornach (DE); STMICROELECTRONICS (TOURS) SAS, Tours (FR)

( * ) Notice: Subject to any disclaimer, the term of this patent is extended or adjusted under 35 U.S.C. 154(b) by 16 days.

(21) Appl. No.: 16/897,205

(22) Filed: Jun. 9, 2020

(65) Prior Publication Data
US 2020/0402975 A1 Dec. 24, 2020

(30) Foreign Application Priority Data

Jun. 19, 2019 (FR) ...................... 1906589

(51) Int. Cl.
H01L 27/06 (2006.01)
H01L 21/02 (2006.01)
(Continued)

(52) U.S. Cl.
CPC ...... *H01L 27/0629* (2013.01); *H01L 21/0254* (2013.01); *H01L 21/8252* (2013.01);
(Continued)

(58) Field of Classification Search
CPC ............. H01L 21/0254; H01L 21/8252; H01L 27/0605; H01L 27/0629; H01L 29/2003;
(Continued)

(56) References Cited

U.S. PATENT DOCUMENTS 6,304,137 B1 * 10/2001 Pullen ..................... H02M 1/44
330/10
7,825,435 B2 * 11/2010 Machida ............. H01L 27/0605
257/195
(Continued)

FOREIGN PATENT DOCUMENTS

WO 2019/066974 A1 4/2019

OTHER PUBLICATIONS

Wang, et al., "An Efficient High-Frequency Drive Circuit for GaN Power HFETs", *IEEE Tranxsactions on Industry Applications*, vol. 45(2), Mar. 2009, pp. 843-853.
(Continued)

*Primary Examiner* — Jay C Kim
(74) *Attorney, Agent, or Firm* — SEED INTELLECTUAL PROPERTY LAW GROUP LLP

(57) ABSTRACT

A monolithic component includes a field-effect power transistor and at least one first Schottky diode inside and on top of a gallium nitride substrate.

5 Claims, 5 Drawing Sheets

(51) Int. Cl.
*H01L 21/8252* (2006.01)
*H01L 29/20* (2006.01)
*H01L 29/40* (2006.01)
*H01L 29/66* (2006.01)
*H01L 29/778* (2006.01)
*H01L 29/872* (2006.01)

(52) U.S. Cl.
CPC ...... *H01L 27/0605* (2013.01); *H01L 29/2003* (2013.01); *H01L 29/40* (2013.01); *H01L 29/66212* (2013.01); *H01L 29/66462* (2013.01); *H01L 29/7786* (2013.01); *H01L 29/872* (2013.01)

(58) Field of Classification Search
CPC ............... H01L 29/40; H01L 29/66212; H01L 29/66462; H01L 29/7786; H01L 29/872
See application file for complete search history.

(56) References Cited

U.S. PATENT DOCUMENTS

| | | | | |
|---|---|---|---|---|
| 7,898,004 B2* | 3/2011 | Wu | ...................... | H01L 29/2003 257/199 |
| 7,915,645 B2* | 5/2011 | Briere | ................ | H01L 29/2003 257/195 |
| 8,227,810 B2* | 7/2012 | Okada | ................... | H01L 29/872 257/E21.403 |
| 8,546,849 B2* | 10/2013 | Cheah | ............... | H01L 23/49524 257/195 |
| 8,772,842 B2* | 7/2014 | Dora | .................... | H01L 29/402 257/256 |
| 8,895,993 B2* | 11/2014 | Kalnitsky | ......... | H01L 29/66143 257/77 |
| 8,946,724 B1* | 2/2015 | Shinohara | ............ | H01L 29/201 257/104 |
| 8,981,380 B2* | 3/2015 | Briere | .................... | H03K 17/74 257/77 |
| 9,087,704 B2* | 7/2015 | Jeon | .................... | H01L 27/0605 |
| 9,142,550 B2* | 9/2015 | Prechtl | .................. | H01L 29/778 |
| 9,220,135 B2* | 12/2015 | Huang | .................... | H01L 27/15 |
| 9,306,544 B2* | 4/2016 | Jeon | .................... | H03K 17/6871 |
| 9,484,418 B2* | 11/2016 | Huang | .................. | H01L 29/861 |
| 9,536,984 B2* | 1/2017 | Azize | .................... | H01L 29/872 |
| 9,543,841 B2* | 1/2017 | Boulharts | ............. | H02M 5/458 |
| 9,685,857 B2* | 6/2017 | Barauna | ................ | H02M 3/156 |
| 9,859,882 B2* | 1/2018 | Zhang | .................. | H03K 17/107 |
| 10,224,401 B2* | 3/2019 | Mishra | ................ | H01L 29/2003 |
| 10,263,538 B2* | 4/2019 | Ikeda | .................... | H02M 7/537 |
| 10,388,650 B2* | 8/2019 | Wang | ................ | H01L 29/42324 |
| 10,573,516 B2* | 2/2020 | Odnoblyudov | ..... | H01L 21/0245 |
| 10,749,019 B2* | 8/2020 | Jeon | .................... | H01L 27/0605 |
| 11,335,799 B2* | 5/2022 | Jiang | .................. | H01L 29/7783 |
| 2013/0009165 A1 | 1/2013 | Park et al. | | |
| 2013/0248931 A1 | 9/2013 | Saito et al. | | |
| 2016/0086938 A1 | 3/2016 | Kinzer | | |
| 2019/0096879 A1* | 3/2019 | Chen | .................. | H01L 27/0629 |

OTHER PUBLICATIONS

Seidel et al., "Integrated Gate Drivers Based on High-Voltage Energy Storing for GaN Transistors," *IEEE Journal of Solid-State Circuits* 53(12):3446-3454, Dec. 2018.

* cited by examiner

MONOLITHIC COMPONENT COMPRISING A GALLIUM NITRIDE POWER TRANSISTOR

BACKGROUND

Technical Field

The present disclosure generally concerns the field of electronic power components, and more particularly aims at a monolithic electronic component comprising a gallium nitride field-effect power transistor.

Description of the Related Art

Various technological families of field-effect power transistors have been provided, among which, in particular, silicon transistors, silicon carbide transistors, and gallium nitride transistors.

Gallium nitride field-effect power transistors are here more particularly considered.

It would be desirable to at least partly overcome certain disadvantages of known electronic components integrating gallium nitride field-effect transistors.

BRIEF SUMMARY

An embodiment provides a monolithic component comprising a field-effect power transistor and at least one first Schottky diode inside and on top of a same gallium nitride substrate.

According to an embodiment, the first Schottky diode has a first electrode connected to the gate of the transistor and a second electrode connected to a first connection terminal of the component.

According to an embodiment, the first connection terminal is intended to receive a first fixed voltage corresponding to a voltage for controlling the transistor to a first state, on or off.

According to an embodiment, the component further comprises a second Schottky diode formed inside and on top of the gallium nitride substrate.

According to an embodiment, the second Schottky diode has a first electrode connected to the gate of the transistor and a second electrode connected to a second connection terminal of the component.

According to an embodiment, the second connection terminal is intended to receive a second fixed voltage corresponding to a voltage for controlling the transistor to a second state, off or on.

According to an embodiment, the component further comprises a drain connection terminal, a source connection terminal, and a gate connection terminal respectively connected to the drain, to the source, and to the gate of the transistor.

Another embodiment provides a circuit, comprising:
the above defined component; and
a first capacitor connected between the first connection terminal of the component and the source connection terminal of the component.

According to an embodiment, the circuit further comprises a second capacitor connected between the second connection terminal of the component and the source connection terminal of the component.

According to an embodiment, the circuit further comprises a control circuit comprising a first connection terminal supplying a first fixed voltage corresponding to a terminal for controlling the transistor to a first state, on or off, a second connection terminal, and a first controlled switch coupling the first connection terminal of the control circuit to the second connection terminal of the control circuit, the first connection terminal of the control circuit being connected to the first connection terminal of the component, and the second connection terminal of the control circuit being coupled to the gate connection terminal of the component.

According to an embodiment, the control circuit comprises a third connection terminal supplying a second fixed voltage corresponding to a voltage for controlling the transistor to a second state, off or on, a fourth connection terminal, and a second controlled switch coupling the third connection terminal of the control circuit to the fourth connection terminal of the control circuit, the third connection terminal of the control circuit being connected to the second connection terminal of the component, and the fourth connection terminal of the control circuit being coupled to the gate connection terminal of the component.

Another embodiment provides a method of manufacturing the above defined component, comprising the successive steps of:
a) providing a gallium nitride substrate;
b) forming the gate of the transistor on the side of the upper surface of the substrate;
c) depositing a passivation layer;
d) forming a trench in the passivation layer; and
e) forming in said trench a metallization defining the anode of the first Schottky diode.

According to an embodiment:
before step b), the substrate is coated with an aluminum-gallium nitride layer;
at step d), the trench formed in the passivation layer emerges into or onto the aluminum-gallium nitride layer or into or onto the substrate; and
at step e), the metallization formed in said trench forms a Schottky contact with the aluminum-gallium nitride layer, or with the substrate.

According to an embodiment, at step b), a localized opening emerging into or onto the substrate is formed in the aluminum-gallium nitride layer, and an insulated gate stack defining the gate of the transistor is formed in said opening.

According to an embodiment, at step b), a gallium nitride based semiconductive region is formed by localized epitaxy on the upper surface of the aluminum-gallium nitride layer, and a metallization defining the gate of the transistor is formed on and in contact with the upper surface of said region.

According to an embodiment, the method further comprises, after the forming of the passivation layer, the successive steps of:
simultaneously forming in the passivation layer first, second, and third trenches emerging into or onto the substrate; and
simultaneously forming in the first, second and third trenches first, second, and third metallizations each forming an ohmic contact with the substrate and respectively defining a cathode contact of the first Schottky diode, a source contact of the transistor, and a drain contact of the transistor.

The foregoing and other features and advantages will be discussed in detail in the following non-limiting description of specific embodiments in connection with the accompanying drawings.

DETAILED DESCRIPTION

Figure 1:
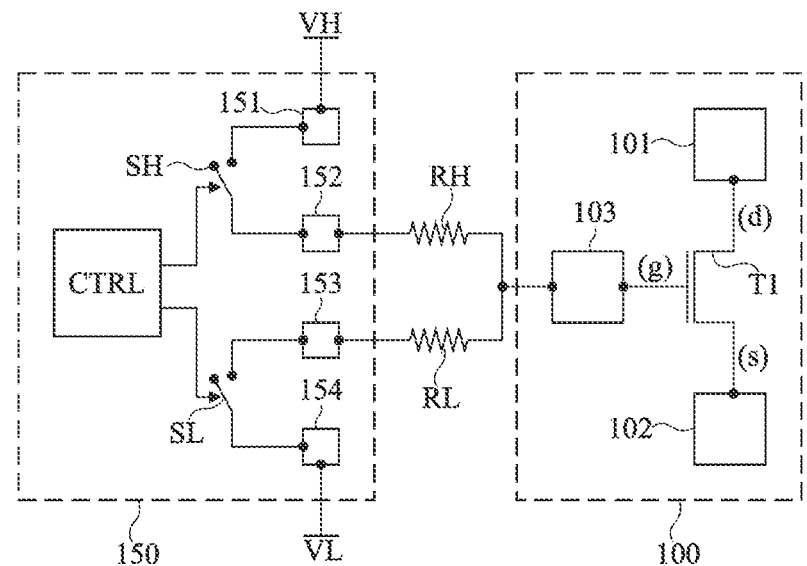
FIG. 1 is an electric diagram of an example of a circuit comprising a monolithic component integrating a gallium nitride field-effect power transistor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the various uses that can be made of the described power components have not been detailed, the described embodiments being compatible with usual applications of monolithic components integrating gallium nitride field-effect power transistors. Further, the forming of the circuits for controlling the described components has not been detailed, the forming of such circuits being within the abilities of those skilled in the art based on the indications of the present description.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "rear", "top", "bottom", "left", "right", etc., or relative positions, such as terms "above", "under", "upper", "lower", "lateral", etc., or to terms qualifying directions, such as terms "horizontal", "vertical", etc., it is referred to the orientation of the drawings, it being understood that, in practice, the described photodetectors may be oriented differently.

The terms "about", "substantially", and "approximately" are used herein to designate a tolerance of plus or minus 10%, preferably of plus or minus 5%, of the value in question.

It should be noted that power transistor here means a transistor capable of withstanding relatively high voltages in the off (non-conductive) state, for example, voltages greater than 100 V and preferably greater than 500 V, and of conducting relatively high currents in the on (conductive) state, for example, currents greater than 1 A and preferably greater than 5 A.

FIG. 1 is an electric diagram of a circuit comprising a monolithic component 100 integrating a gallium nitride field-effect power transistor T1.

Transistor T1 is formed inside and on top of a substrate made up of gallium nitride (not shown in FIG. 1), for example a bulk gallium nitride substrate, a substrate comprising a gallium nitride layer on a silicon support, a substrate comprising a gallium nitride layer on a silicon carbide support, or a substrate comprising a gallium nitride layer on a sapphire support. As an example, transistor T1 is a HEMT ("High Electron Mobility Transistor") transistor.

Component 100 may comprise an encapsulation package (not detailed in the drawing), for example, made of an insulating material, leaving access to three metal terminals of connection to an external device 101, 102, and 103, respectively connected to the drain (d), to the source (s), and to the gate (g) of transistor T1.

The circuit of FIG. 1 further comprises a circuit 150 for controlling transistor T1. Circuit 150 is for example an integrated circuit external to the package of component 100, formed inside and on top of a semiconductor substrate different from the substrate of transistor 100, for example, a silicon substrate. In this example, circuit 150 comprises four metal connection terminals 151, 152, 153, and 154.

Terminals 151 and 154 are intended to respectively receive a high control voltage VH and a low control voltage VL, supplied by a power supply circuit external to circuit 150, not detailed in the drawing. Voltages VH and VL are referenced with respect to the source (s) terminal 102 of transistor T1. Voltage VH may be a positive voltage, and voltage VL may be a negative or zero voltage. As an example, voltage VH is in the range from 2 to 15 V, for example, in the order of 6 volts, and voltage VL is in the range from —10 to 0 V, for example, in the order of −3 V.

Terminals 152 and 153 are terminals supplying high and low control signals intended to be coupled to the gate (g) terminal 103 of transistor T1. In this example, terminal 152 is coupled to terminal 103 by a resistor RH, and terminal 153 is coupled to terminal 103 by a resistor RL. More particularly, resistor RH has a first end coupled, for example, connected, to terminal 152 and a second end coupled, for example, connected, to terminal 103, and resistor RL has a first end coupled, for example, connected, to terminal 153 and second end coupled, for example, connected, to terminal 103. Resistors RH and RL are for example discrete resistors external to circuit 150 and to component 100.

Circuit 150 further comprises a switch SH coupling, by its conduction nodes, terminal 151 to terminal 152 and a switch SL coupling, by its conduction nodes, terminal 154 to terminal 153. Switches SH and SL are for example MOS transistors controlled in switched mode. As an example, transistor SH is a P-channel MOS transistor having its source coupled, for example, connected, to terminal 151 and having its drain coupled, for example, connected, to terminal 153, and transistor SL is an N-channel MOS transistor having its source coupled, for example, connected, to terminal 154 and having its drain coupled, for example, connected, to terminal 153.

Circuit 150 further comprises a circuit CTRL for controlling switches SH and SL. Circuit CTRL is capable of applying to each of switches SH and SL, on a control node of the switch, for example, the gate in the case of a MOS transistor, a switch turn-off or turn-on control signal. Circuit CTRL is configured to never order at the same time the tuning on of switch SH and the turning on of switch SL, to never short terminals 151 and 152.

The circuit of FIG. 1 operates as follows. To turn on transistor T1, circuit CTRL orders the turning off of switch SL and the turning on of switch SH. This results in the application of a voltage substantially equal to voltage VH between the gate and the source of transistor T1, causing the turning on of transistor T1. To turn off transistor T1, circuit CTRL orders the turning off of switch SH and the turning on of switch SL. This results in the application of a voltage substantially equal to voltage VL between the gate and the source of transistor T1, causing the turning off of transistor T1.

A limitation of the assembly of FIG. 1 is due to parasitic inductances of the connection between transistor T1 and circuit 150. Such inductances cause the occurrence of oscillations and/or of voltage peaks between the gate and the source of transistor T1 on switching of transistor T1 from the on (conductive) state to the off (non-conductive) state and/or on switching of transistors T1 from the off state to the on state, which may result in malfunctions. In particular, the gate-source voltage of the transistor may reach, in absolute value, a voltage greater than the maximum gate-source voltage that the transistor can withstand. This results in a risk of damaging the gate of transistor T1. This particularly raises an issue in the case of gallium nitride power transistors. Indeed, in usual gallium nitride field-effect transistor manufacturing technologies, and particular for gallium nitride HEMT transistors, the maximum gate source voltage VGSMAX that the transistor can withstand with no damage is generally very close to the high control voltage VH of the transistor, and the minimum gate source voltage VGSMIN that the transistor can withstand with no damage is generally very close to the low control voltage VL of the transistor. As an example, voltage VGSMAX is greater by less by 5 V, for example, by less than 2 V, than voltage VH. As an example, voltage VGSMIN is smaller by less than 10 V, for example, by less than 5 V, than voltage VL. As a result, parasitic oscillations and/or voltage peaks on the gate of transistor T1, even of relatively low amplitudes, may cause a damaging of the gate of transistor T1.

Resistors RH and RL enable to limit the current slope between the source and the drain of transistor T1 during switching operations, and accordingly the amplitude of the parasitic oscillations and/or voltage peaks on the gate of transistor T1 during switching operations. This enables to protect the gate of the transistor, but to the detriment of the switching speed of the transistors, which is thereby decreased.

According to an aspect of an embodiment, a monolithic component comprising a gallium nitride field-effect power transistor is provided, which component further comprises at least one Schottky diode connected to the gate of the power transistor, enabling to avoid the occurrence of destructive overvoltages on the gate of the transistor, without having to decrease its switching speed.

Figure 2:
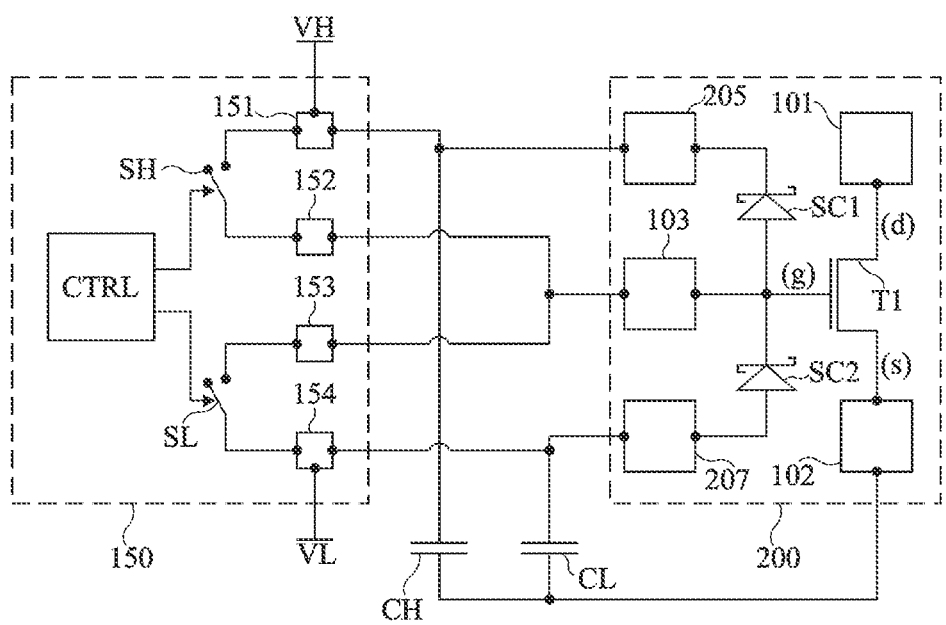
FIG. 2 is an electric diagram of an example of a circuit comprising an embodiment of a monolithic component integrating a gallium nitride field-effect power transistor.

FIG. 2 is an electric diagram of an example of a circuit comprising a monolithic electronic component 200 according to an embodiment.

The circuit of FIG. 2 comprises elements common with the circuit of FIG. 1. In the following, the common elements will not be detailed again, and only the differences between the two circuits will be highlighted.

Component 200 of FIG. 2 comprises the same elements as component 100 of FIG. 1, that is, a transistor T1 formed inside and on top of a substrate made up of gallium nitride (not shown in FIG. 2), for example, a HEMT transistor, and an encapsulation package (not detailed in the drawing), for example, made of an insulating material, leaving access to three metal terminals 101, 102, and 103, for connection to an external device, which are respectively connected to the drain (d), to the source (s), and to the gate (g) of transistor T1.

Component 200 of FIG. 2 further comprises two Schottky diodes SC1 and SC2, for example, identical or similar, formed inside and on top of the same gallium nitride substrate as transistor T1. Schottky diode SC1 has its anode coupled, for example, connected, to the gate of transistor T1 and Schottky diode SC2 has its cathode coupled, for example, connected, to the gate of transistor T1.

In this example, the encapsulation package of the component further leaves access to two metal terminals 205 and 207, for connection to an external device, which are different from terminals 101, 102, and 103, and are coupled, for example, connected, respectively to the cathode of Schottky diode SC1 and to the anode of Schottky diode SC2.

The circuit of FIG. 2 further comprises a circuit 150 for controlling transistor T1, identical or similar to circuit 150 of FIG. 1.

In this example, resistors RH and RL are omitted, that is, the control terminals 152 and 153 of circuit 150 are directly connected to terminal 103 of component 200.

Further, in this example, terminals 151 and 154 of circuit 150 are respectively connected to terminals 205 and 207 of component 200.

The circuit of FIG. 2 further comprises a capacitor CH having a first electrode coupled, for example, connected, to terminal 205 of component 200 and a second electrode coupled, for example, connected, to terminal 102 of component 200, and a capacitor CL, for example, identical or similar to capacitor CH, having a first electrode coupled, for example connected, to terminal 207 of component 200 and a second electrode coupled, for example, connected, to terminal 102 of component 200. Capacitors CH and CL are for example discrete capacitors external to circuit 150 and to component 200.

The operation of the circuit of FIG. 2 is similar to that of the circuit of FIG. 1. In particular, to turn on transistor T1, circuit CTRL orders the turning off of switch SL and the turning on of switch SH. This results in the application of a voltage substantially equal to voltage VH between the gate and the source of transistor T1, causing the turning on of transistor T1. To turn off transistor T1, circuit CTRL orders the turning off of switch SH and the turning on of switch SL. This results in the application of a voltage substantially equal to voltage VL between the gate and the source of transistor T1, causing the turning off of transistor T1.

In normal operation, capacitors CH and CL are respectively charged to voltage VH and to voltage VL.

In case of a positive overvoltage peak on the gate of transistor T1, if the value of the overvoltage exceeds voltage VH plus the threshold voltage of diode SC1, the overvoltage is discharged via diode SC1 and capacitor CH, which enables to protect the gate of transistor T1. In case of a negative overvoltage peak on the gate of transistor T1, if the value of the overvoltage exceeds voltage VL minus the threshold voltage of diode SC2, the overvoltage is discharged via diode SC2 and capacitor CL, which enables to protect the gate oxide of transistor T1. As an example, the forward voltage drop of each of diodes SC1 and SC2 is in the order of 0.6 V at 10 mA and in the order of 1.2 V at 4 A.

An advantage of the embodiment of FIG. 2 is to enable to protect the gate of transistor T1 without having to limit the switching speed of transistor T1. In particular, as compared with the assembly of FIG. 1, resistances RH and/or RL may be decreased, or even totally suppressed as shown in FIG. 2.

The fact for Schottky diodes SC1 and SC2 to be monolithically integrated inside and on top of the same semiconductor substrate as transistor T1 enables to make parasitic inductances of connection between diodes SC1 and SC2 and the gate of transistor T1 negligible. This enables to particularly rapidly carry off positive and negative overvoltages as soon as they appear.

In this example, capacitors CH and CL are external components, for example, directly welded to terminals 205, 207, and 102 of component 200. This enables to limit the surface area of the gallium nitride substrate of component 200. As a variation, capacitors CH and CL may be monolithically integrated inside and/or on top of the gallium nitride substrate of component 200.

As an example, each of capacitors CH and CL has a capacitance in the range from 10 to 500 nF, for example, in the order of 220 nF.

Diodes SC1 and SC2 may be relatively low-voltage diodes. As an example, diodes SC1 and SC2 have a breakdown voltage smaller than 50 V, for example, in the order of 30 V. Each of diodes SC1 and SC2 for example occupies a surface area of the gallium nitride substrate in the range from 0.2 to 2 mm$^2$, for example, in the range from 0.5 to 1.5 mm$^2$.

FIGS. 3 to 10 schematically and partially illustrate steps of an example of a method of manufacturing the monolithic component 200 of FIG. 2. In this example, transistor T1 is a HEMT transistor.

Figure 3:
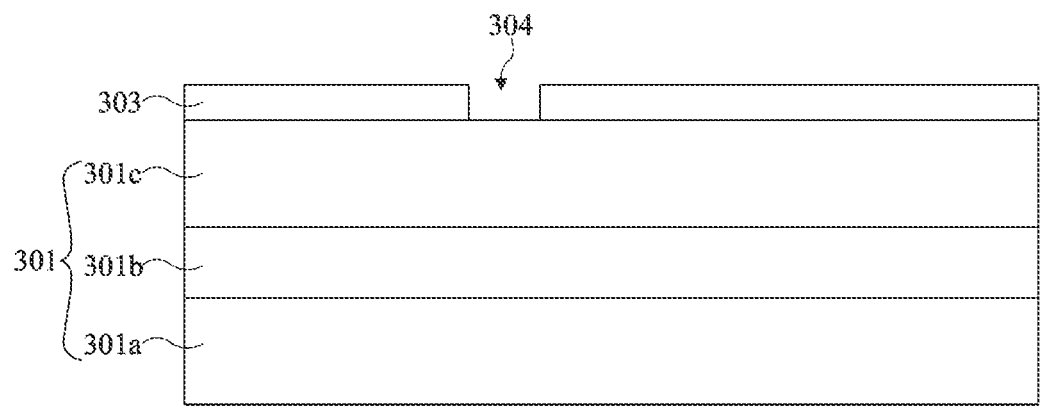
FIG. 3 illustrates a step of a method of manufacturing a monolithic component integrating a gallium nitride field-effect power transistor according to an embodiment.

FIG. 3 is a cross-section view showing a gallium nitride substrate 301. In this example, the substrate comprises a carbon-doped gallium nitride layer 301a, a magnesium-doped gallium nitride layer 301b, arranged on top of and in contact with the upper surface of layer 301a, and a non-intentionally doped gallium nitride layer 301c, arranged on top of and in contact with the upper surface of layer 301b. Layer 301c is for example formed by epitaxy from the upper surface of layer 301b. Substrate 301 may itself rest on a support, not shown, for example, made of silicon or of sapphire. As a variation, layers 301a and 301b may be replaced with any other layer or any other stack of layers enabling to form epitaxial layer 301c.

FIG. 3 illustrates a step of forming of an aluminum-gallium nitride layer 303 on top of and in contact with the upper surface of layer 301c. Layer 303 may be continuously formed over the entire upper surface of substrate 301, for example, by epitaxy.

FIG. 3 further illustrates the forming, in layer 303, for the future gate region of transistor T1, of a local through opening 304 emerging onto the upper surface of gallium nitride layer 301c. Opening 304 may be formed by photolithography and etching.

Figure 4:
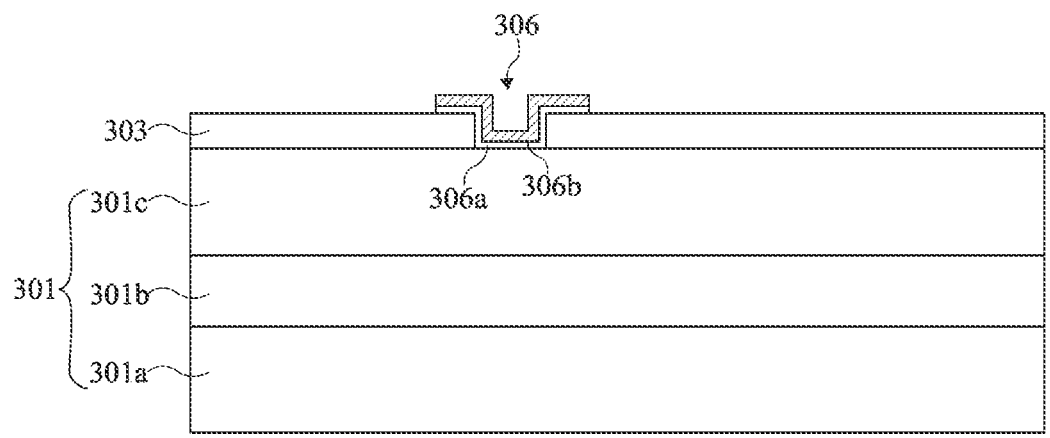
FIG. 4 illustrates another step of the method of FIG. 3.

FIG. 4 is a cross-section view illustrating a subsequent step of forming of an insulated gate stack 306 in opening 304. Insulated gate stack 306 may comprise a dielectric layer 306a, for example, made of silicon oxide, arranged on top of and in contact with the upper surface of gallium nitride layer 301c, at the bottom of opening 304, and a conductive layer 306b, for example metallic, arranged on top of and in contact with the upper surface of layer 306a. Layers 306a and 306b respectively correspond to the gate insulator and to the gate conductor of transistor T1. In the shown example, insulated gate stack 306 extends not only at the bottom of opening 304, on top of and in contact with the upper surface of layer 301c, but further extends on top of and in contact with the lateral walls of opening 304, and on top of and in contact with a portion of the upper of layer 303, at the periphery of opening 303. As an example, to form insulated gate stack 306, layers 306a and 306b are first successively continuously deposited, over the entire upper surface of the structure obtained after the forming of opening 304 in layer 303, and then layers 306a and 306b are locally etched, for example, by photolithography and etching, to only keep gate stack 306.

Figure 5:
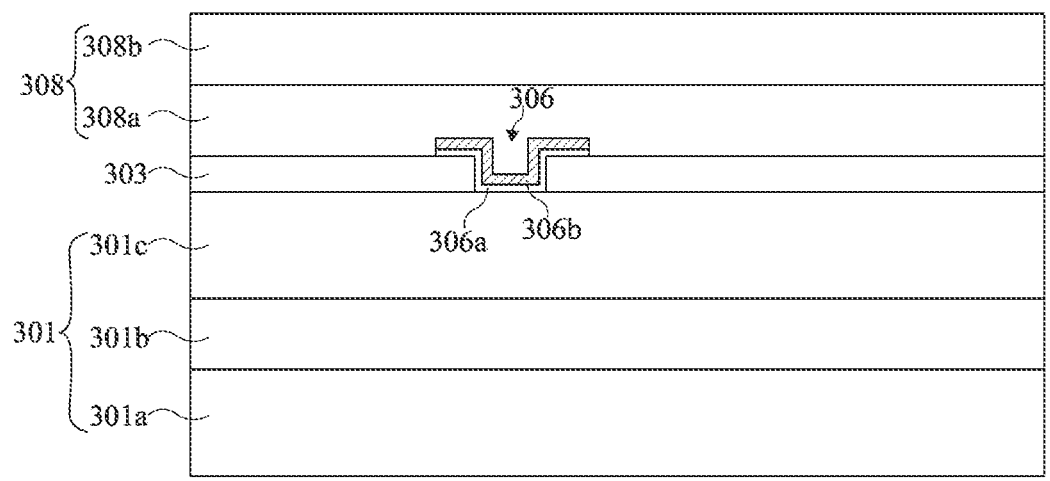
FIG. 5 illustrates another step of the method of FIGS. 3 and 4.

FIG. 5 is a cross-section view illustrating a subsequent step of deposition of a passivation layer 308 on the upper surface of the structure obtained after the forming of gate stack 306. In this example, passivation layer 308 comprises a silicon nitride layer 308a arranged on top of and in contact with the upper surface of aluminum-gallium nitride layer 303 and on top of and in contact with the upper surface of insulated gate stack 306, and a silicon oxide layer 308b arranged on top of and in contact with the upper surface of layer 308a. Passivation layer 308 for example extends continuously over the entire upper surface of the structure obtained after the forming of insulated gate stack 306.

Figure 6:
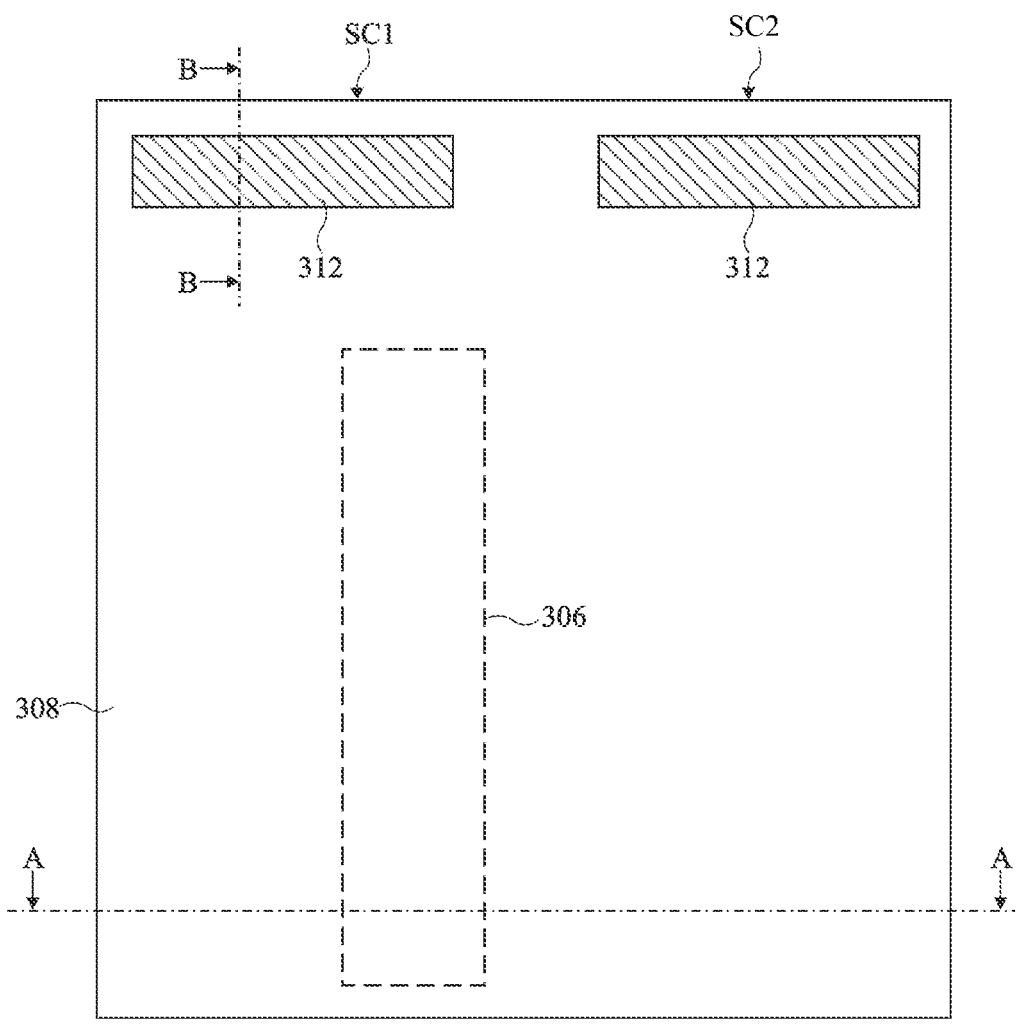
FIG. 6 illustrates another step of the method of FIGS. 3 to 5.
Figure 7:
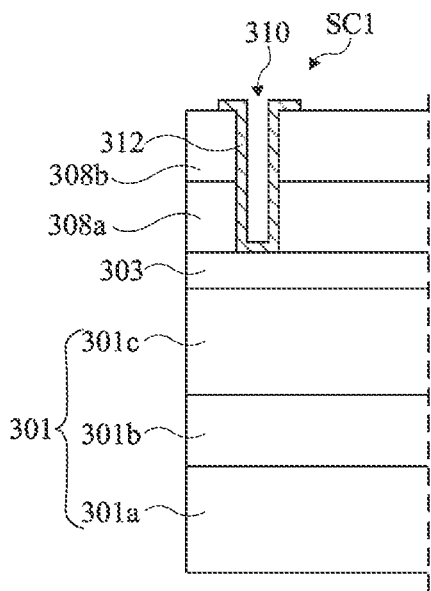
FIG. 7 illustrates another step of the method of FIGS. 3 to 6.

FIGS. 6 and 7 respectively are a top view and a cross-section view illustrating subsequent steps of forming of anode metallizations 312 of Schottky diodes SC1 and SC2. In FIG. 6, axes A-A and B-B have been shown, respectively corresponding to the cross-section plane of FIGS. 3, 4, and 5, and to the cross-section plane of FIG. 7.

In this example, the Schottky barrier of each of diodes SC1 and SC2 is formed between the upper surface of aluminum-gallium nitride layer 303 and the anode metallization 312 of the diode. For each of diodes SC1 and SC2, a local trench 310 is first formed from the upper surface of layer 308, trench 310 extending vertically through layer 308 and emerging onto the upper surface of layer 303 or at an intermediate level of the thickness of layer 303, for the future anode metallization 312 of the diode. Trench 310 is for example formed by photolithography and etching. Metallization 312 is then deposited in contact with the upper surface of layer 303 at the bottom of trench 310. Metallization 312 is for example made of titanium nitride or of tungsten. In the shown example, metallization 312 extends not only at the bottom of trench 310 on top of and in contact with the upper surface of layer 303, but also on top of and in contact with the lateral walls of trench 310 and on top of and in contact with the upper surface of passivation layer 308 at the periphery of trench 310. As an example, a layer of the material(s) forming metallization 312 is first continuously deposited over the entire upper surface of the structure obtained after the forming of trenches 310, after which this layer is locally etched, for example, by photolithography and etching, to only keep anode contact metallizations 312 of diodes SC1 and SC2.

As a variation, the Schottky barrier may be formed between the upper surface of gallium nitride layer 301c and the anode metallization 312 of each diode. In this case, trench 310 extends up to the upper surface of layer 301c or up to an intermediate level of the thickness of layer 301c.

Figure 8:
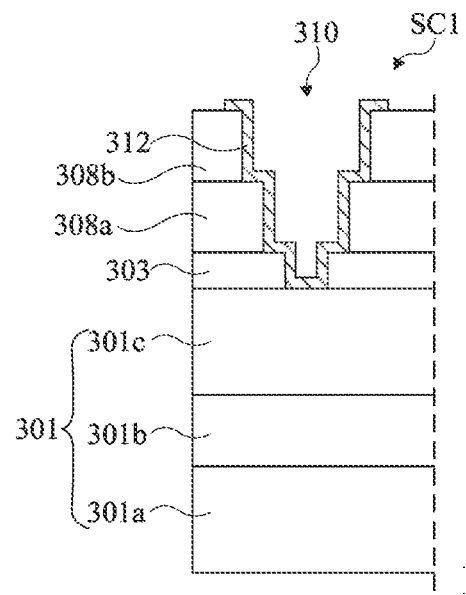
FIG. 8 illustrates a variation of the step of FIG. 7.

One will note that trench 310 may comprise on or a plurality of steps formed on the different interfaces encountered, for example on layer 308a, on layer 303, or, if applicable, on layer 301c, as illustrated on FIG. 8.

Figure 9:
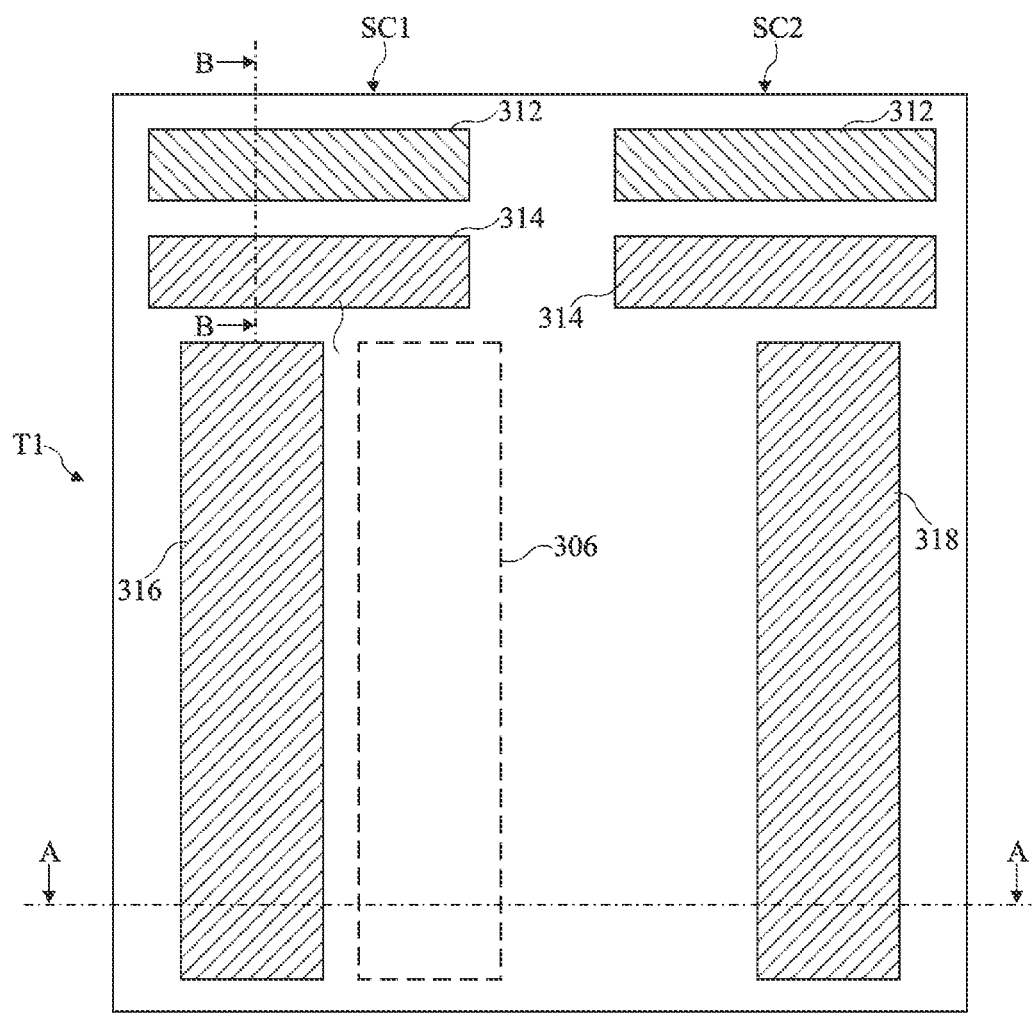
FIG. 9 illustrates another step of the method of FIGS. 3 to 8.
Figure 10:
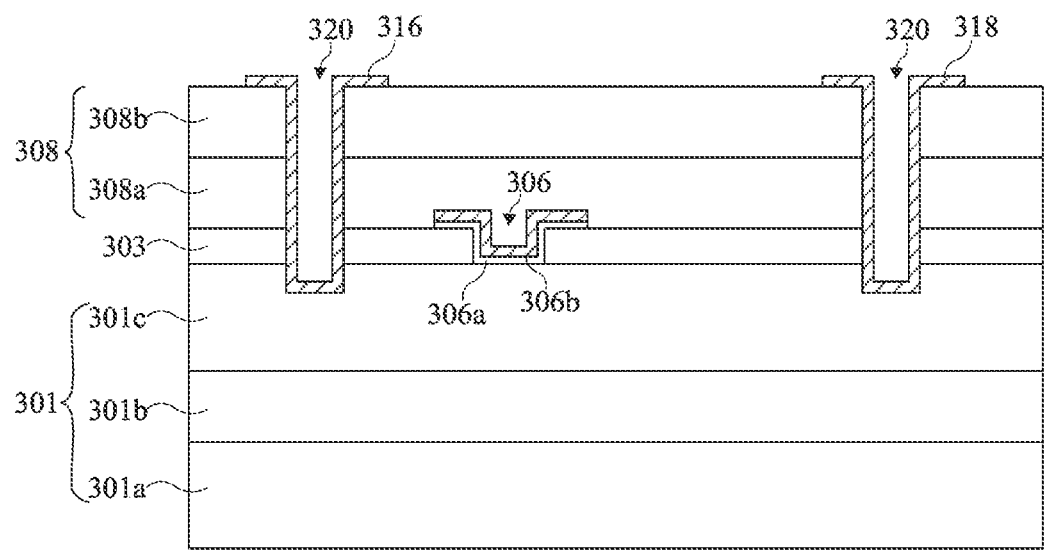
FIG. 10 illustrates another step of the method of FIGS. 3 to 9.
Figure 11:
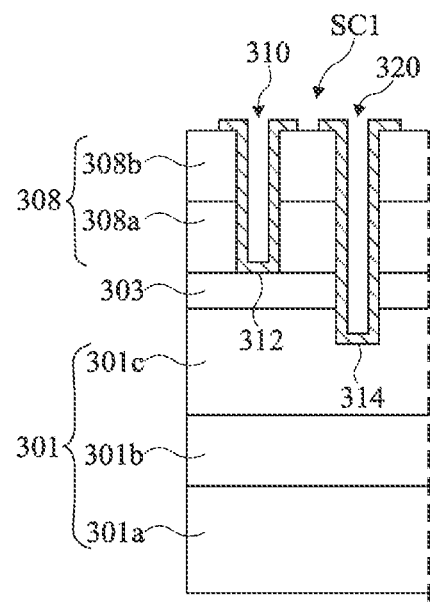
FIG. 11 illustrates another step of the method of FIGS. 3 to 10.

FIGS. 9, 10, and 11 are respectively a top view and cross-section views illustrating subsequent steps of forming of the conductive cathode contact regions 314 of Schottky diodes SC1 and SC2 and of the conductive source 316 and drain 318 contact regions of transistor T1. In FIG. 9, axes A-A and B-B have been shown, respectively corresponding to the cross-section plane of FIG. 10 (identical to the cross-section plane of FIGS. 3, 4, and 5) and to the cross-section plane of FIG. 11 (identical to the cross-section plane of FIG. 7).

In this example, conductive contact regions 314, 316, and 318 are simultaneously formed. For each of conductive contact regions 314, 316, and 318, a local trench 320 is first formed from the upper surface of layer 308, trench 320 vertically extending through layers 308 and 303 and emerging onto layer 301c or onto the upper surface of layer 301c. Trenches 320 are for example formed by photolithography and etching. Conductive contact region 314, respectively 316, respectively 318, is then deposited in contact with the upper surface of layer 301c at the bottom of trench 320. Each of conductive contact regions 314, 316, and 318 forms an ohmic contact with the gallium nitride layer 301c at the bottom of the corresponding trench 320. Conductive contact regions 314, 316, and 318 are for example made of metal. In the shown example, each of conductive contact regions 314, 316, and 318 extends not only at the bottom of the corresponding trench 320, on top of and in contact with the upper surface of layer 301c, but also on top of and in contact with the lateral walls of the trench and on top of and in contact with the upper surface of passivation layer 308 at the periphery of trench 320. As an example, a layer of the material(s) forming conductive contact regions 314, 316, and 318 is first continuously deposited over the entire upper surface of the structure obtained after the forming of trenches 320, after which this layer is locally etched, for example, by photolithography and etching, to only keep conductive contact regions 314, 316, and 318.

Subsequent steps (not detailed in the drawings) of deposition of one or a plurality of upper interconnection metal levels, for example, three metal levels separated two by two by insulating levels, may then be implemented to connect the anode of diode SC1 and the cathode of diode SC2 to the gate of transistor T1, and to form connection pads 101, 102, 103, 205, and 207 respectively connected to the drain of transistor T1, to the source of transistor T1, to the gate of transistor T1, to the cathode of diode SC1, and to the anode of diode SC2.

In the example described in relation with FIGS. 3 to 11, transistor T1 is a metal-oxide-semiconductor (MOS) type transistor. The described embodiments are however not limited to this particular case. As a variation, transistor T1 may be a JFET transistor, or junction field effect transistor, comprising a conductive gate forming a ohmic contact or a Schottky contact with a semiconductive layer.

Figure 12:
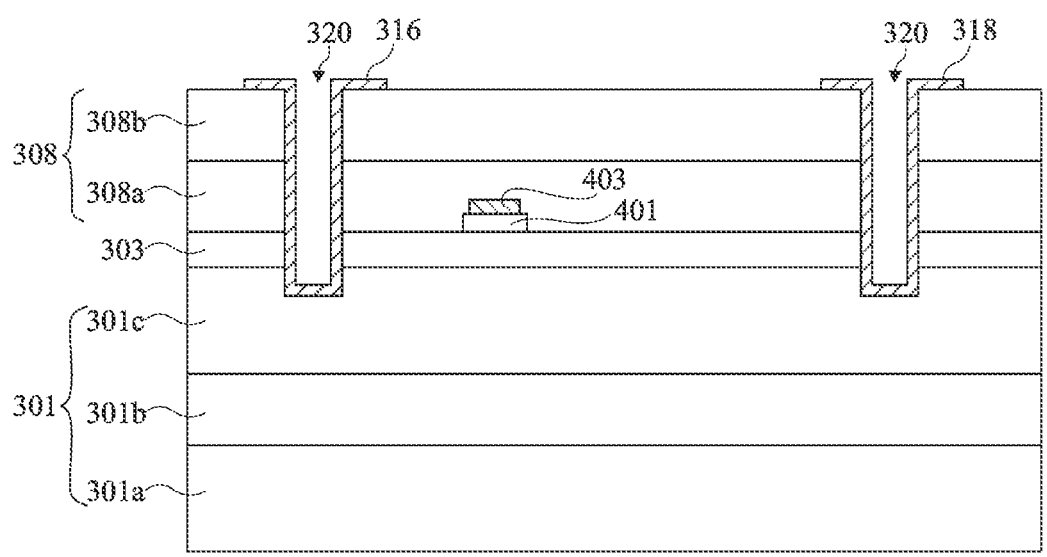
FIG. 12 illustrates a variation of the method of FIGS. 3 to 11.

FIG. 12 is a cross-section view in the same plane as FIG. 10, illustrating a variation of an embodiment wherein transistor T1 is a JFET transistor.

In the example of FIG. 12, the step of forming opening 304 in layer 303 (FIG. 3) is omitted. Instead, a gallium nitride based semiconductive region 401, for example a P-doped gallium nitride region, is formed by localized epitaxy on the upper surface of layer 303, opposite the future gate region of the transistor. A metallization 403 is then formed on and in contact with the upper surface of region 401. Metallization 403 forms an ohmic or a Schottky contact with region 401, and constitutes the gate of transistor T1.

Various embodiments and variations have been described. Those skilled in the art will understand that certain characteristics of these various embodiments and variations may be combined, and other variations will occur to those skilled in the art. In particular, the described embodiments are not limited to the example of a method of manufacturing the component 200 described in relation with FIGS. 3 to 12.

Further, the described embodiments are not limited to the above-described example where component 200 comprises two Schottky protection diodes SC1 and SC2. In certain applications, it is sufficient for the gate of transistor T1 to be protected against positive overvoltage peaks only. In this case, diode SC2 and connection pad 207 of component 200 may be omitted. Further, capacitor CL of the circuit of FIG. 2 may be omitted. In other applications, it is sufficient for the gate of transistor T1 to be protected against negative overvoltage peaks only. In this case, diode SC1 and connection pad 205 of component 200 may be omitted. Further, the capacitor CH of the circuit of FIG. 2 may be omitted.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic component comprising:
   gallium nitride substrate;
   an aluminum-gallium nitride layer;
   first and second connection terminals on the gallium nitride substrate;
   a field-effect power transistor on the gallium nitride substrate and including a gate structure, source, and drain, the gate structure being directly on the gallium nitride substrate and includes a gate dielectric layer and a gate electrode;
   a passivation layer on the gate structure of the field-effect power transistor;
   a first Schottky diode on the gallium nitride substrate and coupled between and to both the first connection terminal and the gate electrode of the field-effect power transistor; and
   a second Schottky diode on the gallium nitride substrate and coupled between and to both the second connection terminal and the gate electrode of the field-effect power transistor, the source and drain of the field-effect power transistor and cathode terminals of each of the first Schottky diode and the second Schottky diode are in respective trenches extending in the passivation layer to the gallium nitride substrate, anode terminals of each of the first Schottky diode and the second Schottky diode are in respective trenches extending in the passivation layer to the aluminum-gallium nitride layer.

2. The component of claim 1, wherein the first Schottky diode has an anode electrode coupled to the gate electrode of the field-effect power transistor and a cathode electrode coupled to the first connection terminal.

3. The component of claim 2, wherein:
   the first connection terminal is configured to receive a first fixed voltage corresponding to a voltage for controlling the field-effect power transistor to a first state, on or off; and the second connection terminal is intended to receive a second fixed voltage corresponding to a voltage for controlling the field-effect power transistor to a second state, off or on.

4. The component of claim 1, wherein the second Schottky diode has a cathode electrode coupled to the gate electrode of the field-effect power transistor and an anode electrode coupled to the second connection terminal.

5. The component of claim 1, further comprising a drain connection terminal, a source connection terminal, and a gate connection terminal respectively coupled to the drain, to the source, and to the gate electrode of the field-effect power transistor.

\* \* \* \* \*